United States Patent
Chang et al.

(10) Patent No.: US 6,544,844 B2
(45) Date of Patent: Apr. 8, 2003

(54) METHOD FOR FORMING A FLASH MEMORY CELL HAVING CONTOURED FLOATING GATE SURFACE

(75) Inventors: Yun Chang, Hsinchu (TW); Chin-Yi Huang, Pao Shan (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/818,078

(22) Filed: Mar. 27, 2001

(65) Prior Publication Data

US 2001/0042882 A1 Nov. 22, 2001

Related U.S. Application Data

(63) Continuation-in-part of application No. 09/415,939, filed on Oct. 8, 1999, and a continuation-in-part of application No. 09/415,938, filed on Oct. 8, 1999, and a continuation-in-part of application No. 09/415,936, filed on Oct. 8, 1999, now Pat. No. 6,413,818, and a continuation-in-part of application No. 09/415,788, filed on Oct. 8, 1999, now Pat. No. 6,248,631.

(51) Int. Cl.$^7$ ............................................. H01L 21/336
(52) U.S. Cl. ........................................ 438/257; 438/271
(58) Field of Search ................................. 438/257, 258, 438/259, 262, 263, 264, 266, 954, 271, 361, 555, 553, 680, 689, 692

(56) References Cited

U.S. PATENT DOCUMENTS

| | | | | |
|---|---|---|---|---|
| 5,019,879 A | * | 5/1991 | Chiu ........................... 357/23.5 |
| 5,284,785 A | | 2/1994 | Gill ............................... 437/43 |
| 5,489,548 A | | 2/1996 | Nishioka et al. ............... 437/60 |
| 5,526,307 A | * | 6/1996 | Yiu et al. ............... 365/185.01 |
| 5,583,066 A | | 12/1996 | Jung ............................. 437/43 |
| 5,661,055 A | | 8/1997 | Hsu et al. .................... 438/259 |
| 5,677,216 A | | 10/1997 | Tseng ........................... 437/43 |
| 5,680,345 A | | 10/1997 | Hsu et al. ............... 365/185.01 |
| 5,696,019 A | | 12/1997 | Chang ........................... 437/67 |
| 5,739,566 A | | 4/1998 | Ota .............................. 257/315 |
| 5,915,177 A | | 6/1999 | Tseng ........................... 438/264 |
| 5,923,974 A | | 7/1999 | Liang et al. .................. 438/257 |
| 5,962,889 A | * | 10/1999 | Yamauchi et al. ........... 257/317 |
| 6,002,151 A | | 12/1999 | Liu et al. ...................... 257/316 |
| 6,054,733 A | | 4/2000 | Doan et al. ................... 257/315 |
| 6,069,040 A | | 5/2000 | Miles et al. .................. 438/260 |
| 6,124,167 A | * | 9/2000 | Kao et al. .................... 438/257 |
| 6,130,140 A | | 10/2000 | Gonzalez ..................... 438/430 |
| 6,159,796 A | | 12/2000 | Dietz et al. .................. 438/257 |
| 6,248,631 B1 | * | 6/2001 | Huang et al. ................ 438/260 |

FOREIGN PATENT DOCUMENTS

| | | |
|---|---|---|
| EP | 0495113 A1 | 7/1992 |
| JP | 53-144692 | 5/1977 |
| JP | 11274439 A | 9/1999 |

OTHER PUBLICATIONS

Kobayashi et al. "A 0.24–$\mu m^2$ Cell Process with 0.18–$\mu m$ Width Isolation and 3–D Interpoly Dielectric Films for 1–Gb Flash Memories" IEDM 97–275, 3 pages.

Kitamura et al. "A Low Voltage Operating Flash Memory Cell with High Coupling Ratio Using Horned Floating Gate with Fine HSG", 1998 Symposium on VLSI Technology Digest of Technical Papers.

* cited by examiner

Primary Examiner—David Nelms
Assistant Examiner—David Nhu
(74) Attorney, Agent, or Firm—Ernest J. Beffel, Jr.; Haynes Beffel & Wolfeld LLP

(57) ABSTRACT

Methods are provided for forming a contoured floating gate for use in a floating gate memory cell. One method includes forming a floating gate that has a polysilicon layer over a substrate, forming oxide layers on opposing sides of the floating gate, the oxide layer having a vertical thickness greater than a vertical thickness of the floating gate; forming a spacer layer over the oxide layers and the floating gate; removing a portion of the spacer layer such that a top surface of the floating gate positioned laterally toward a middle region of the floating gate is exposed; and removing a portion of the floating gate underlying the exposed top surface of the middle region to form the contoured floating gate.

31 Claims, 7 Drawing Sheets

METHOD FOR FORMING A FLASH MEMORY CELL HAVING CONTOURED FLOATING GATE SURFACE

CROSS-REFERENCE TO RELATED APPLICATIONS

This application is a continuation-in-part of U.S. patent application Ser. No. 09/415,939, filed Oct. 8, 1999 and entitled "Flash Memory Cell Having Contoured Floating Gate Surface" (now abandoned), which is hereby incorporated by reference for all purposes. This application is also a continuation-in-part of U.S. patent application Ser. No. 09/415,936, filed Oct. 8, 1999 and entitled "A Method for Forming a Contoured Floating Gate Cell" now U.S. Pat. No. 6,413,818, which is hereby incorporated by reference for all purposes. This application is also a continuation-in-part of U.S. patent application Ser. No. 09/415,938, filed Oct. 8, 1999 and entitled "A V-Shaped Floating Gate for a Floating Gate Memory Cell" (now abandoned), which is hereby incorporated by reference for all purposes. This application is also a continuation-in-part of U.S. patent application Ser. No. 09/415,788, filed Oct. 8, 1999 and entitled "A Method for Forming a V-Shaped Floating Gate", now U.S. Pat. No. 6,248,631, which is hereby incorporated by reference for all purposes.

BACKGROUND OF THE INVENTION

1. Field of the Invention

The present invention relates to non-volatile digital memory, and more particularly, to FLASH EPROM memory technology incorporating floating gates having reduced lateral dimensions.

2. Description of Related Art

FLASH EPROM memory is a class of non-volatile storage integrated circuits. In general, FLASH EPROMS have the capability of electrically erasing, programming, or reading a memory cell on a chip. Generally, a FLASH EPROM includes a floating gate and a control gate which form an electrical connection. A FLASH EPROM operates by charging or discharging electrons in the floating gate of the memory cell in a capacitative manner. The floating gate is formed of a conductive material, typically made of polysilicon, which is insulated from the channel of the transistor by a layer of oxide or other insulating material, and insulated from the control gate or word-line of the transistor by a second layer of insulating material.

The act of charging the floating gate is termed a "program" step for a FLASH EPROM. The program step may be accomplished through so-called hot electron injection by establishing a large positive voltage between the control gate and the source. The act of discharging the floating gate is called the "erase" function for a FLASH EPROM. The erase function is typically carried out by an F-N tunneling mechanism between the floating gate and the source of the transistor (source erase) or between the floating gate and the substrate (channel erase).

Due to increasing memory demands, a need exists to further reduce the size of memory devices, such as FLASH EPROMs. Reducing the cell size of memory devices increases performance and reduces power consumption.

Several devices have been developed with reduced cell size. One such device is described in "A Low Voltage Operating Flash Memory Cell with High Coupling Ratio Using Homed Floating Gate with Fine HSG," by Kitamura et al., 1998 Symposium on VLSI Technology Digest of Technical Papers. Another example of a memory device with reduced cell size is described in "A 0.24-$\mu$m Cell Process With 0.18-$\mu$m Width Isolation and 3D Interpoly Dielectric Films for 1-GB Flash Memories" by Kobayashi et al., IEEE 97–275 (1997).

Reducing the size of a memory cell has lead to memory cells with certain disadvantages including overbearing floating gates, or intermediate structures formed during the manufacturing of the floating gate, which degrade the tunnel oxide layer. The formation of sharp corners on the floating gate also leads to charge leakage.

SUMMARY OF THE INVENTION

A floating gate for use in a memory cell is provided which comprises a first end region adjacent a first lateral end of the floating gate; and a middle region positioned laterally toward a middle of the floating gate relative to the first end region, the middle region having a vertical thickness which is less than a vertical thickness of the first end region; wherein the floating gate is composed of a material which is formed during a single fabrication step and shaped to form the first end region and middle region by one or more subsequent fabrication steps.

In one variation, the first end region and the middle region have top surfaces which are substantially parallel to a plane of a substrate underlying the floating gate, the top surfaces of the first end region and middle region being connected to one another by a surface which is substantially perpendicular to the plane of the substrate underlying the floating gate.

In another variation, the floating gate further includes a first sloped region positioned between the first end region and the middle region. The first sloped region may be shaped to have a top surface which is positioned at an angle between about 0 and 45 degrees relative to a line perpendicular to a plane of a substrate underlying the floating gate.

A floating gate for use in a memory cell is also provided which comprises a first end region adjacent a first lateral end of the floating gate; a second end region adjacent a second lateral end of the floating gate opposite the first lateral end; and a middle region positioned laterally between the first and second end regions, the middle region having a vertical thickness which is less than a vertical thickness of the first end region and which is less than a vertical thickness of the second end region; wherein the floating gate is composed of a material which is formed during a single fabrication step and shaped to form the first and second end regions and middle region by one or more subsequent fabrication steps.

In one variation, the first and second end regions and the middle region have top surfaces which are substantially parallel to a plane of a substrate underlying the floating gate, the top surfaces of the first end region and middle region are connected to one another by a surface which is substantially perpendicular to the plane of the substrate underlying the floating gate and the top surfaces of the second end region and middle region are connected to one another by a surface which is substantially perpendicular to the plane of the substrate underlying the floating gate.

In another variation, the floating gate further includes a first sloped region positioned between the first end region and the middle region and a second sloped region positioned between the second end region and the middle region. The first and second sloped regions may be shaped to have top surfaces which are positioned at an angle between about 0 and 45 degrees relative to a line perpendicular to a plane of a substrate underlying the floating gate.

According to the above embodiments, the first and second end regions and the middle region may have top surfaces which are substantially planar. The first and second end regions and middle regions may also have top surfaces which are substantially parallel to a plane of a substrate underlying the floating gate.

Also according to the above embodiments, the floating gate preferably has a bottom surface facing a plane of a substrate underlying the floating gate, the floating gate being positioned substantially within a lateral footprint defined by the bottom surface of the floating gate.

Also according to the above embodiments, the first end region, middle region and second end region combined have a width of less than one micron, and preferably less than about 0.5 micron.

In regard to each of the above floating gate embodiments, the floating gate may be incorporated into a floating gate memory cell comprising: a substrate; source and drain regions positioned over the substrate; an insulating layer positioned over the source and drain regions; the floating gate positioned over the insulating layer between the source and drain regions; and a control gate positioned over the dielectric insulator.

Also provided according to the present invention are methods for fabricating the floating gates of the present invention. According to one embodiment, a method is provided for forming a contoured floating gate for use in a floating gate memory cell the method including forming a floating gate comprising a polysilicon layer over a substrate; forming oxide layers on opposing sides of the floating gate, the oxide layer having a vertical thickness greater than a vertical thickness of the floating gate; forming a spacer layer over the oxide layers and the floating gate; removing a portion of the spacer layer such that side walls leave a top surface of the floating gate positioned laterally toward a middle region of the floating gate is exposed; and removing a portion of the floating gate underlying the exposed top surface of the middle region to form the contoured floating gate.

In one variation of the method, the floating gate includes a first end region at a first lateral end of the floating gate and a second end region at a second lateral end of the floating gate, where the spacer layer formed during the step of forming the spacer layer has a vertical thickness at the first end region and a vertical thickness at the second end region that are each greater than a vertical thickness of the spacer layer at the middle region.

In other variations, the floating gate includes a first end region at a first lateral end of the floating gate and a second end region at a second lateral end of the floating gate and wherein the floating gate, after removing the portion of the floating gate, has a vertical thickness at the middle region that is less than a vertical thickness of the floating gate at the first end region and less than a vertical thickness of the floating gate at the second end region.

Still further, the step of forming the floating gate may include planarizing a top surface of the floating gate. The step of removing a portion of the floating gate may include forming a new top surface in the middle region which is substantially parallel to the substrate. The step of removing a portion of the floating gate may also create a rectangular shaped recess in the middle region of the floating gate. The step of removing a portion of the floating gate may alternatively create a recess in the floating gate having first and second sloped surfaces at angles less than 90° relative to the substrate, in which the first and second sloped surfaces may also be at angles between about 45° and 90° relative to the substrate. In still another variation, the step of forming the floating gate includes depositing the polysilicon layer and a masking layer over an insulating layer.

In regard to each of the above floating gate embodiments, a method for forming a floating gate memory cell comprises the steps of providing a substrate; forming source and drain regions over the substrate; depositing an insulating layer over the source and drain regions; and forming a contoured floating gate positioned over the insulating layer between the source and drain regions.

BRIEF DESCRIPTION OF THE FIGURES

FIG. 4A illustrates a relatively thin tunnel oxide layer grown over a substrate.

FIG. 4B illustrates the polysilicon layer and masking layer being etched away to form a pattern of columns.

FIG. 4C illustrates oxide structures being deposited between the columns so that each column is abutted by an oxide structure.

FIG. 4D illustrates the masking layer being removed to create a step topography between the polysilicon layer and the oxide structure.

FIG. 4E illustrates a spacer layer deposited over the step topography comprising the columns and the oxide structures.

FIG. 4F illustrates the spacer layer etched back to selectively remove all of the spacer layer on top of the oxide structures.

FIG. 4G illustrates a portion of the floating gate formed by the polysilicon layer is removed to form a new top surface to the middle region.

FIG. 4H illustrates the oxide structure dipped back to shorten the top surface of the oxide structure and to form a contoured top or coupling surface on top of the polysilicon layer.

FIG. 4I illustrates the dielectric layer deposited over the polysilicon layer and the oxide layer.

DETAILED DESCRIPTION

Figure 1:
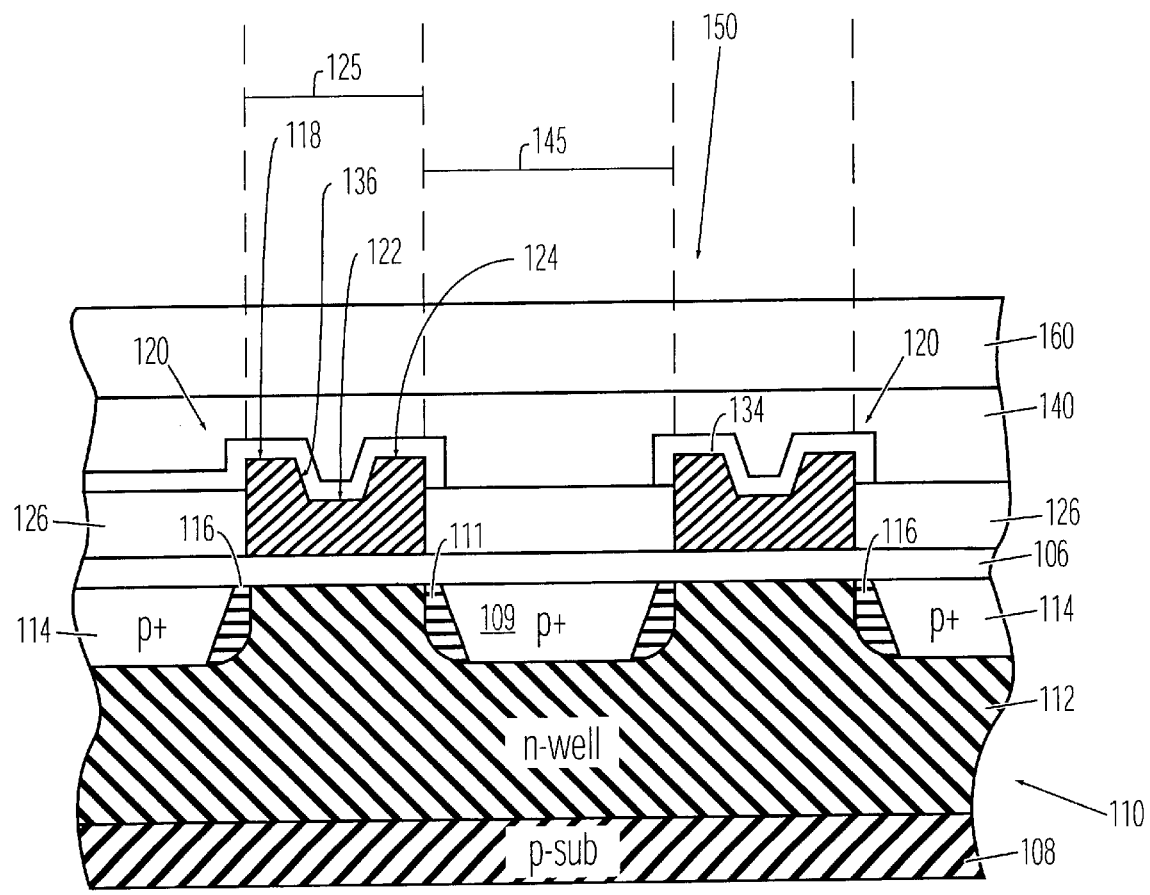
FIG. 1 illustrates a memory cell according to the present invention.

The present invention relates to a flash memory cell design having a reduced lateral dimension by utilizing a floating gate with a contoured coupling surface. The contoured coupling surface is created by taking material for forming the floating gate and shaping the material to form a floating gate which varies in thickness across its lateral dimension.

In one embodiment, the floating gate comprises a first end region adjacent a first end of the floating gate and a middle region positioned toward a middle of the floating gate relative to the first end region which has a thickness which is less than a thickness of the first end region.

In another embodiment, the floating gate comprises a first end region adjacent a first end of the floating gate, a second end region adjacent a second end of the floating gate, and a middle region positioned between the first and second end regions which has a thickness which is less than a thickness of the first end region and a thickness of the second end region.

In another embodiment, the floating gate comprises a first end region adjacent a first end of the floating gate, a second end region adjacent a second end of the floating gate, a middle region positioned between the first and second end regions which has a thickness which is less than a thickness of the first end region and a thickness of the second end region, a first sloped region positioned between the first end region with the middle region, and a second sloped region positioned between the second end region with the middle region. In this embodiment, the first and second sloped regions are preferably shaped to have a top surface which is positioned at an angle between about 0 and 45 degrees relative to a line perpendicular to a plane of a substrate underlying the floating gate.

In regard to each of the above embodiments, the various regions of the floating gate are formed of a material which is formed by a single fabrication step. Subsequent to the material's formation, one or more additional fabrication steps are employed to shape the floating gate.

In regard to each of the above embodiments, the first and second end regions preferably have a substantially planar top surface. The planar top surface of the end regions is preferably parallel to a plane of a substrate underlying the floating gate.

In regard to each of the above embodiments, the middle region preferably has a substantially planar top surface. The top surface of the middle region is also preferably parallel to a plane of a substrate underlying the floating gate.

Also in regarding each of the above embodiments, the floating gate is preferably substantially positioned within a lateral footprint defined by a surface of the floating gate underlying the floating gate. Preferably the first end portion, middle portion and second end portion combined in the lateral dimension are less than 1.0 micron wide and more preferably less than 0.5 micron wide.

The present invention also relates to methods for fabricating a floating gate according to this invention. According to one embodiment, the method comprises forming a floating gate comprising a polysilicon layer over a substrate; providing oxide layers on opposing sides of the floating gate which have a vertical thickness that is greater than a vertical thickness of the floating gate; forming a spacer layer over the oxide layers and the floating gate; removing a portion of the spacer layer such that a top surface of the floating gate positioned laterally towards a middle region of the floating gate is exposed; and removing a portion of the floating gate underlying the exposed top surfaces of the middle region to form the contoured floating gate.

In another embodiment for fabricating a floating gate memory cell, the method comprises of providing a substrate, forming source and drain regions over the substrate, depositing an insulating layer over the source and drain regions, and forming a contoured floating gate that is positioned over the insulating layer between the source and drain regions.

In regard to each of the embodiments for methods, the floating gate may include a first and second end region adjacent to corresponding lateral ends, where the method includes forming a spacer layer to have a vertical thickness at the first end region and a vertical thickness at a second end region that are each greater than a vertical thickness of the spacer layer at a middle region of the floating gate.

In regard to each of the embodiments for methods, the floating gate may be formed to have a vertical thickness at a middle region that is less than a vertical thickness of the floating gate at the end regions.

As will be described in greater detail below, use of the floating gate of the present invention provides significant advantages in that a smaller memory cell is provided with comparable performance to other FLASH EPROM memory cells know in the art which have larger dimensions. Among other advantages, the memory cell of the present invention is inexpensive to manufacture, and avoids leakage of electrical charge from the floating gate.

FIG. 1 illustrates memory cells according to the invention aligned in a column to form a memory array or FLASH EPROM device. The memory cells in the column share a semiconductor substrate 110. The particular design or formation of the semiconductor substrate 110 may be varied depending on the memory device architecture. For example, for the source-drain-source configuration shown in FIG. 5, the semiconductor substrate 110 may include an n-type well 112 formed in a p-type substrate 108, as illustrated in FIG. 1. Within the substrate 110, a drain junction is formed by buried p-type drain diffusion region 114 and buried drain pocket 116. A source junction is formed by buried p-type source diffusion region 109 and p-type buried source pocket 111. Alternative semiconductor substrates may also be employed with this invention, including using an n-type substrate with a p-type well and n-type diffusion regions.

A floating gate 120 is positioned over the semiconductor substrate 110, between the source 109 and drain 114 regions. A dielectric isolation layer 106 is positioned between the floating gates 120 and the substrate. In a preferred embodiment, the dielectric layer is a tunnel oxide structure. The floating gates 120 are spaced-apart, with oxide structures 126 disposed over an oxide region 145 of the semiconductor substrate 110 and preferably on the tunnel oxide layer 106. Likewise, the floating gates 120 are positioned over a floating gate region 125 of the semiconductor substrate 110 and preferably on the tunnel oxide layer 106. As illustrated in FIG. 1, the floating gate 120 extends laterally in a word line direction. Additional floating gates that comprise the FLASH EPROM of this invention may extend into the paper in a bit-line direction and are not shown by FIG. 5.

Each floating gate includes a top coupling surface extending the width of the floating gate. A control gate 150 is formed over the floating gate 120 to which the floating gate 120 is electrically or capacitively coupled. The control gate 150 may extend over adjacent oxide structures 126.

Another dielectric layer may be disposed between the control gate 150 and the floating gates 120. In a preferred embodiment, the dielectric layer is an oxide-nitride-oxide layer (ONO) 134, and the control gate 150 is formed from a second layer of polysilicon 140 combined with a tungsten-silicon (WSi$_x$) layer 160. The floating gate 120 is preferably formed from a uniform polysilicon body.

Figure 2:
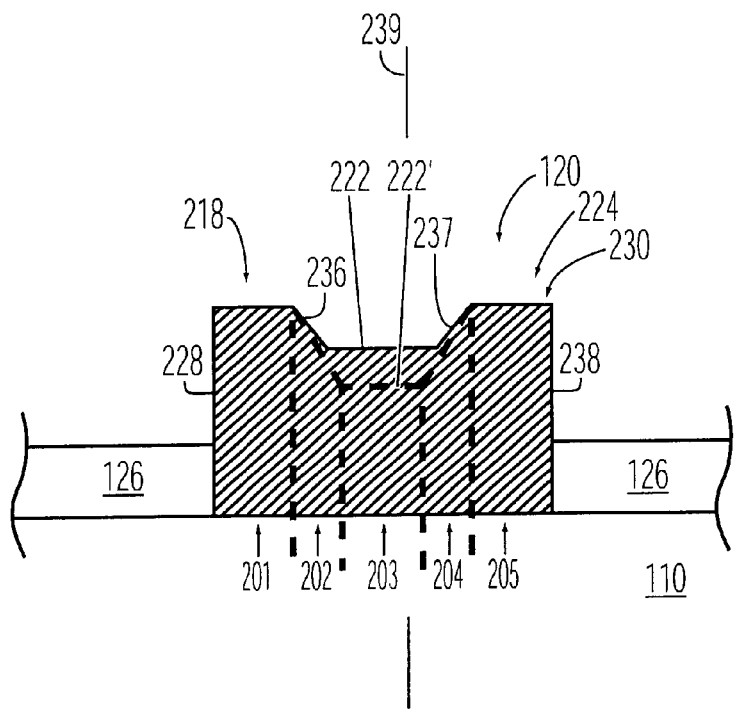
FIG. 2 illustrates an embodiment of a memory cell of the present invention, with variations to the top surface of the floating gate shown in phantom.

The design of floating gates used in the present invention will now be described in greater detail. FIG. 2 illustrates an embodiment of a floating gate according to the present invention. As illustrated, the floating gate 120 may be divided into five regions moving left to right: a first end region 201, a first sloped region 202, a middle region 203, a second sloped region 204, and a second end region 205. As illustrated, the thickness of the floating gate 120 varies between these different regions to create a top coupling surface 130 with a contoured topography.

In the contoured topography, the first and second end regions form raised first and second end surfaces 218 and 224. The floating gate at the middle region 103 is vertically thinner than the end regions and thus forms a recessed middle surface 222. The raised end surfaces 218 and 224 may be aligned over the floating gate region 125 of the semiconductor substrate 110, and preferably over the first and second end regions 201 and 205. The diffusion regions are preferably positioned at the oxide regions 145 adjacent to the first and second end regions 201 and 205. In a preferred embodiment, the raised end surfaces 218, 224 form plateaus that are parallel to the substrate 110. The raised end surfaces 218, 224 are preferably substantially perpendicular to first and second sides 228, 238.

The floating gate at the first and second sloped regions 202, 204 has a vertical thickness which varies between the thickness of the first or second end region and the thickness of the middle region. These regions form first and second sloped surfaces 236, 237 that extend from the first and second end surfaces 218, 224 respectively to the middle surface 222, or 222'. It is noted that when the first and second sloped surfaces 236, 237 are perpendicular to the substrate, the first and second sloped regions are very narrow.

In a preferred embodiment, the sloped surfaces 236, 237 are substantially planar as they extend from the first and second end surfaces 218, 224 to the middle surface 222. The middle surface 222 is preferably substantially parallel to the semiconductor substrate 110.

Figure 3A:
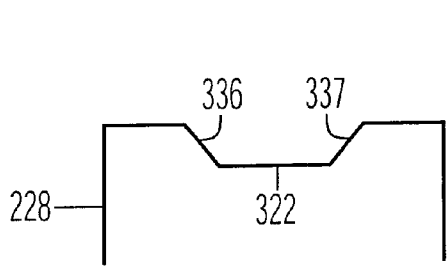
FIG. 3A illustrates a floating gate with a shallow medial surface.
Figure 3B:
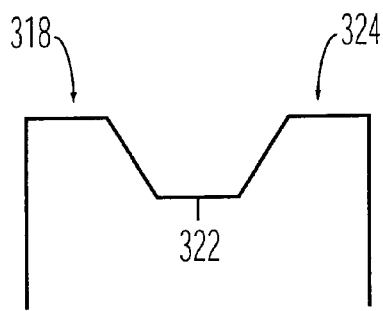
FIGS. 3B–3C illustrate a floating gate with a deep medial surface.
Figure 3C:
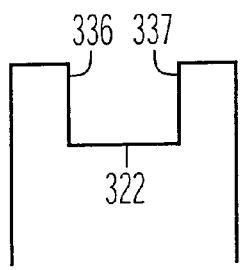
Figure 3D:
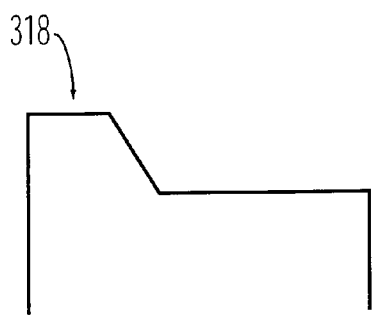
FIG. 3D illustrates a floating gate with a single raised end.

It is noted that the middle surface 222, or 222' may be recessed to different depths relative to the raised end surfaces 218, 224. As a result, the angle of the sloped surfaces 236, 237 relative to a line 239 extending perpendicular from the substrate may be varied. For example, as illustrated in an embodiment of FIG. 3A, the middle surface 322 is not very deep. In this instance, the sloped surfaces 336, 337 are at an angle greater than 45 degrees relative to the perpendicular. As illustrated in another embodiment of FIG. 3B, the middle surface 322 may be recessed deeper relative to the raised end surfaces 318, 324. In this instance, the sloped surfaces 336, 337 are at an angle less than 45 degrees relative to the perpendicular. In a preferred embodiment, the angle of the sloped middle borders is between 45 and 90 degrees. As illustrated in FIG. 3C, when the first and second sloped surfaces 336, 337 are perpendicular to the substrate, the first and second sloped regions are very narrow. The manufacturing process for positioning the middle surface 322 will be described further below.

The width of the floating gate is preferably between about 2,000 and 10,000 Angstroms. The first and second end regions preferably have a thickness between about 1,000 and 9,000 Angstroms. When the floating gate includes both a first and second end region, the first and second end regions 201, 205 are preferably separated from each other by 0.4 microns and alternatively by 0.2 microns. The tunnel oxide layer 106 is preferably between about 50 and 120 Angstroms in thickness. The floating gate poly 104 is preferably between 2,000 and 10,000 Angstroms thick. Further details, variations, and alternatives to the embodiments mentioned above will be made clearer in the discussion below, detailed a process flow for this invention.

Figure 4A:
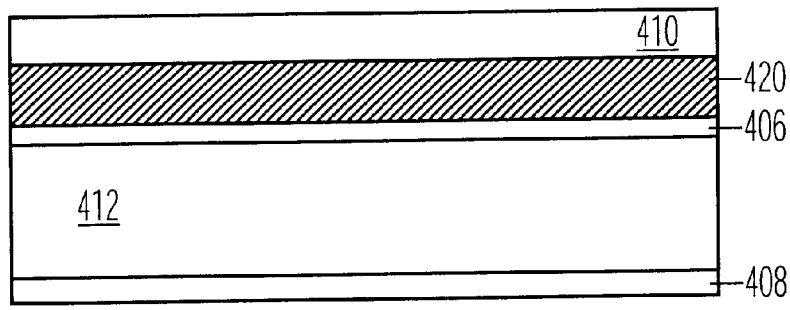
FIGS. 4A–4I illustrate an embodiment of a process for fabricating a memory cell according to the present invention.

FIGS. 4A–4I illustrate an embodiment of a process for fabricating a memory cell according to the present invention, and more specifically, an array of floating gates. As illustrated in FIG. 4A, a relatively thin tunnel oxide layer 406 is grown over a substrate 400. In an embodiment such as the one shown by FIG. 5, the substrate includes a p-type substrate 408 and an n-type well 412. Next, a conductive layer for forming a floating gate such as a polysilicon layer 420 is deposited over the tunnel oxide layer 406, followed by a masking layer 410. The masking layer 410 is preferably $Si_3N_4$, and serves to create an alignment structure for a second masking layer or spacer layer deposited on the substrate at an intermediate manufacturing step (illustrated in FIG. 4E). In view of the high etching selectivity between $Si_3N_4$ and polysilicon, use of $Si_3N_4$ allows the masking layer 410 to be etched away from the memory cell structure without requiring a stop layer to protect the polysilicon layer. Alternative materials to $Si_3N_4$ for the masking layer include polysilicon film. However, using polysilicon film as the masking layer requires using a liner film over the polysilicon layer 420 to provide a stop layer for when the masking layer is eventually removed.

Figure 4B:
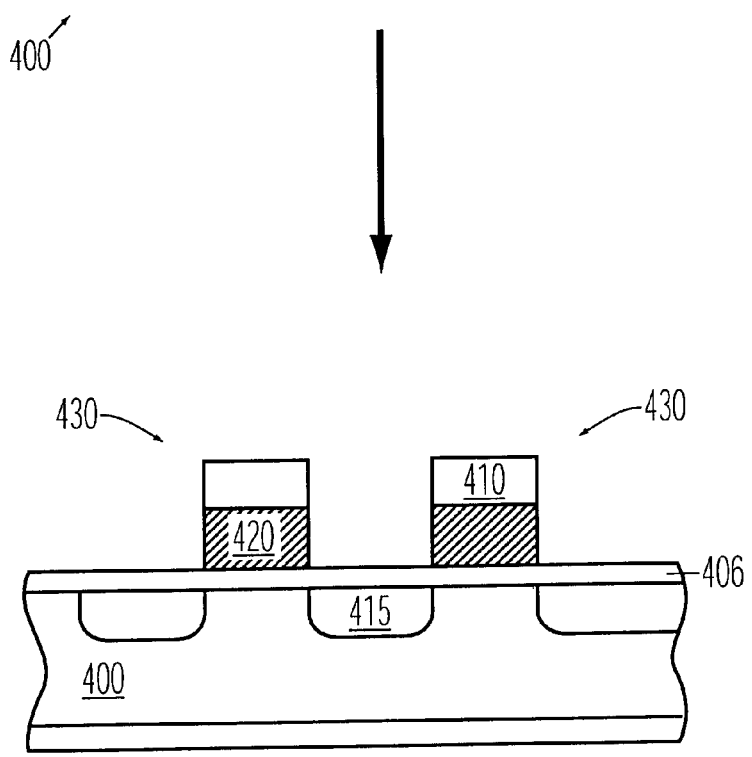

As illustrated in FIG. 4B, the polysilicon layer 420 and masking layer 410 are etched away to form a pattern of columns 430. In this step, dopants are used to create diffusion regions 415 between the columns 430. This may be accomplished using conventional ion implantation methods, although chemical or other similar processes may also be employed. Preferable, a p-type dopant is employed to create the diffusion regions, such as arsenic (As) is implanted into the substrate 400. Other suitable dopants include phosphorous (P).

Figure 4C:
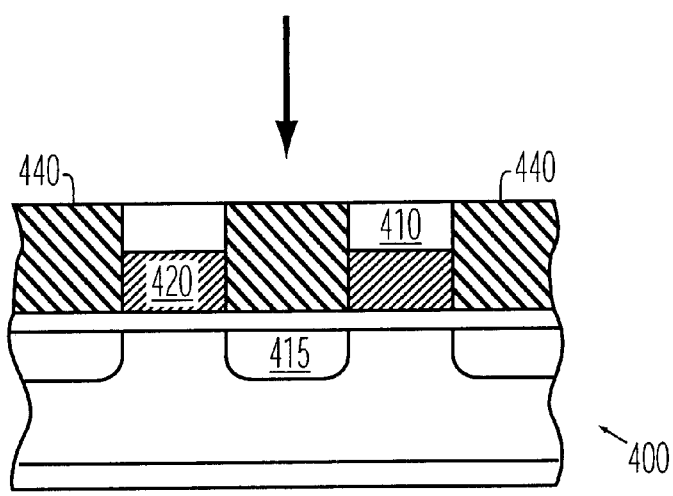

In FIG. 4C, oxide structures 420 are deposited between the columns 430, so that each column is abutted by an oxide structure. Each oxide structure 440 is preferably resistant to etch attacks from subsequent etching of either the polysilicon layer 420 or masking layer 410 described in the subsequent steps. The oxide structure 440 serves to insulate the polysilicon layers 420, while providing an etch stop layer in the word-line direction. By insulated the polysilicon layers 420, the oxide structures 440 prevent leakage of electrons from the floating gate, as well as from the diffusion regions of the substrates. In addition, the oxide structures 440 decrease the drain coupling ratio (DCR), thereby increasing the coupling ratio of the memory cell. The vertical thickness of each oxide structure 440 is preferably on the order of 1500 Angstroms. After the oxide structures 440 are deposited, a topology comprising the oxide structures and the columns 430 is planarized by chemical mechanical polishing (CMP). Alternatively, the top surface may be planarized by using an etch back process.

Figure 4D:
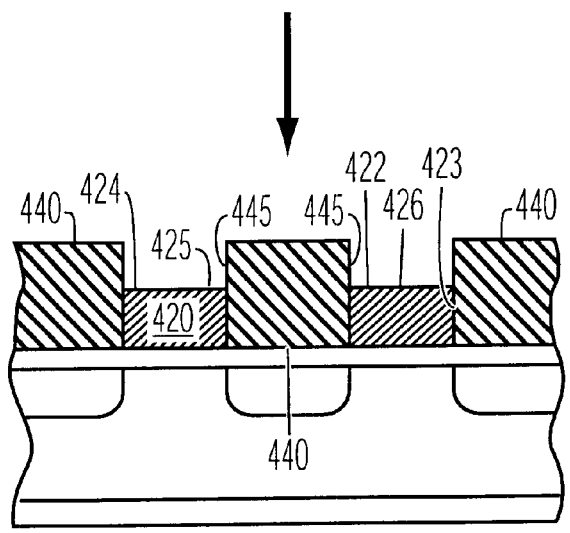

As illustrated in FIG. 4D, the masking layer 410 is then removed to create a step topography between the polysilicon layer 420 and the oxide structure 440, as shown by cavities 445. The step topography forms a self-alignment structure for an oxide spacer to be subsequently deposited in a subsequent step. The polysilicon layer 420 may then be referenced with respect to lateral ends 422, 423 that abut or are adjacent to the oxide structures 440, end regions 424, 425 adjacent to the lateral ends, and a middle region 426 between the end regions.

Figure 4E:
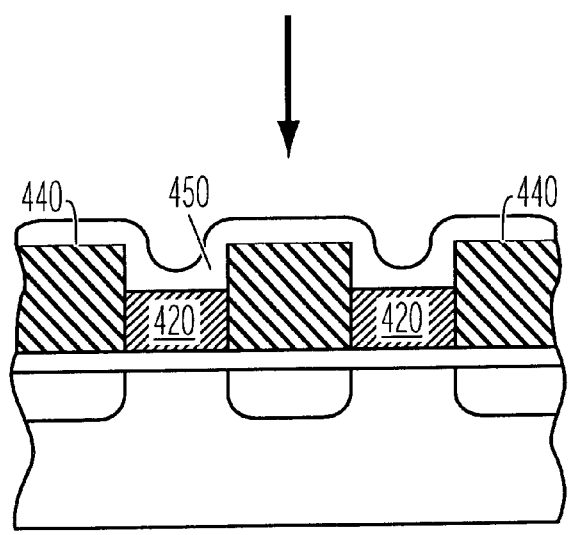

FIG. 4E shows that a spacer layer 450 is deposited over the step topography comprising the columns 430 and the oxide structures 440. Preferably, the spacer layer 450 is a chemical vapor deposited (CVD) oxide formed from $SiO_2$, or alternatively $Si_xO_y$. Alternatively, the spacer layer 450 may be a high density plasma oxide, a film deposited by decomposition of tetraethyl orthosilicate (TEOS) or other similarly formed oxides such as $SiH_4$ oxides. More generally, spacer layer 450 may be an etchable material having high selectively with the underlying polysilicon layer, such as $Si_3N_4$. In one embodiment, the thickness of the spacer layer 450 ranges in general between 500–4000 Angstroms over the oxide structures 440.

Figure 4F:
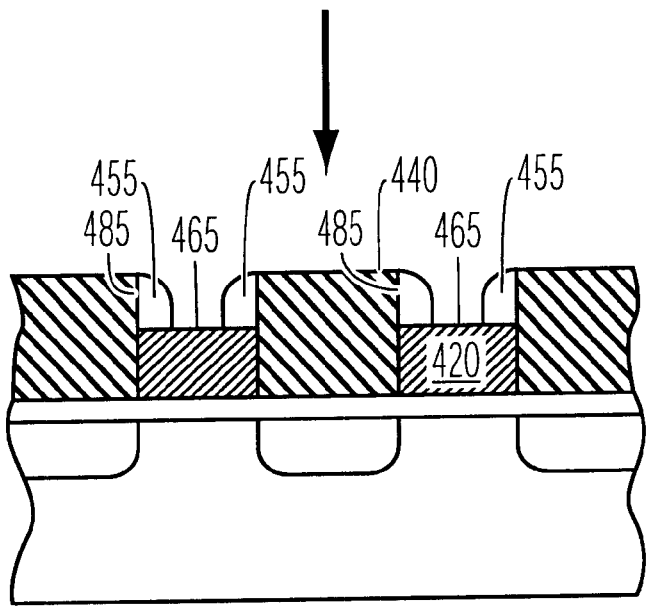

As illustrated in FIG. 4F, the spacer layer 450 is etched back to selectively remove all of the spacer layer on top of the oxide structures 440. Preferably, the etching method employed has high selectivity to the spacer layer 450 so that the spacer layer may be etched away from the oxide structure 440 without removal of the adjacent polysilicon layer 420. Therefore, in a preferred embodiment, the spacer layer 450 has a selectivity ratio with the polysilicon layer 420 of approximately 40:1. The spacer layer 450 bordering the cavities 445 is also partially removed during the etch back so that remaining spacer layers 255 at the end regions form sidewalls 455. The sidewalls 455 extend vertically from the top of the column 430 of FIG. 4B along a vertical surface 485 formed by the oxide structure 440 abutting the column. A polysilicon surface 465 may be exposed between the sidewalls 455. Etching the spacer layer 450 as described in this paragraph allows the resulting topography at this intermediate step to be relatively flat at the oxide structure 440 and, if so desired, at the polysilicon surface 465 exposed between the oxide structures. As will be further described for this preferred embodiment, the width of the sidewalls 455 in the word-line direction corresponds or correlates to the width of the raised end surfaces 118, 124 for the floating gate 120 shown in FIG. 1. Therefore, the width of the sidewalls 455 may be set during the manufacturing process to also form the eventual slope or wordline length of the middle surface 122 and/or middle border 136 shown in FIG. 1. As such, the width of the sidewalls 455 implement a desired coupling ratio for the memory cell formed by this process. In order to maximize the coupling surface of the floating gate, the width of the sidewalls is less than 0.4 µm, preferably, and may still be smaller depending on the needs of the application.

Figure 4G:
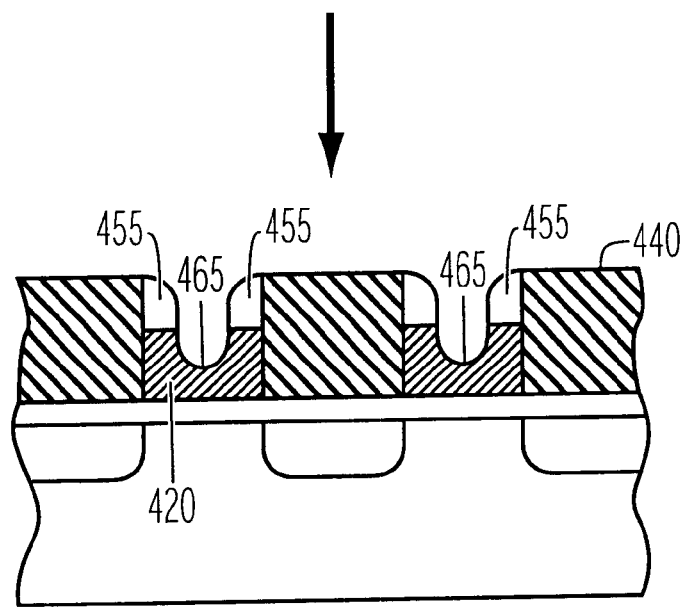

As illustrated in FIG. 4G, a portion of the floating gate formed by the polysilicon layer 420 is removed to form a new top surface to the middle region. Preferably, this is accomplished by etching back the polysilicon layer 420 to form a new polysilicon exposed surface 465'. Due to the high selectivity between the material chosen for the spacer layer 450 and the polysilicon layer 420, the spacer oxide sidewalls 455 are not affected by further etching between the sidewalls 455. Use of the spacer layer 450 provides another advantage to this invention during the etch outlined in this and the preceding step, in that the spacer layer 450 maintains the planarity of top surfaces of end regions, 424, 425 of FIG. 4D corresponding to raised end surfaces 118, 124 of FIG. 1. In this way, raised end surfaces 118, 124 formed during this step avoid sharp peaks and corners present in prior art memory devices employing floating gates with reduced lateral dimensions. Elimination of sharp peaks and corners reduce the leakage and electron instability associated with peaks and corners of the floating gate.

Figure 4H:
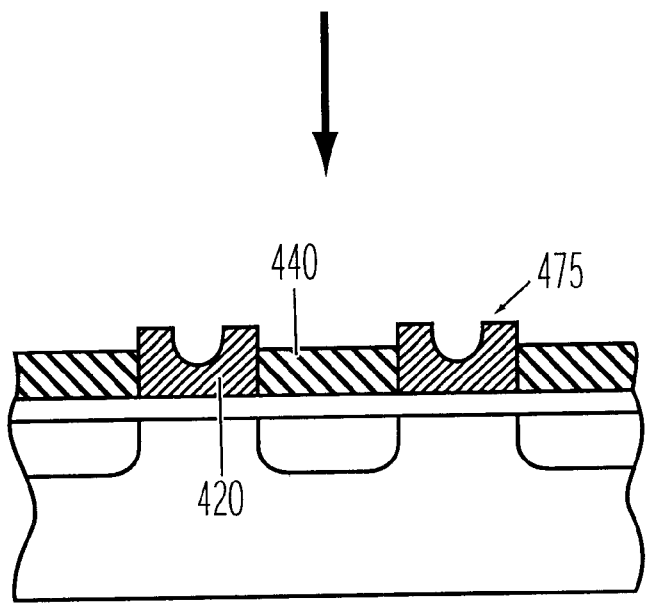

In FIG. 4H, the oxide structure 440 is dipped back to shorten the top surface of the oxide structure and to form a contoured top or coupling surface 475 on top of the polysilicon layer 420. Preferably, the oxide structure 440 is dipped back by a buffer oxide etch dip having a selectivity ratio between 10:1 and 50:1, with a particular preferred embodiment having a selectivity ratio of 40:1. In a preferred embodiment, the resulting coupling surface 475 formed by this process is shaped to provide the raised end surfaces 118, 124 of the floating gate 120 shown in FIG. 1. In this manner, a preferred fabrication process may be used to fabricate a floating gate 120 of FIG. 1, where. the recessed middle surface 122 and raised ends 118 and 124 combine to provide additional surface area to the coupling surface to increase the coupling ratio between the floating gate 120 and the control gate 150.

Figure 4I:
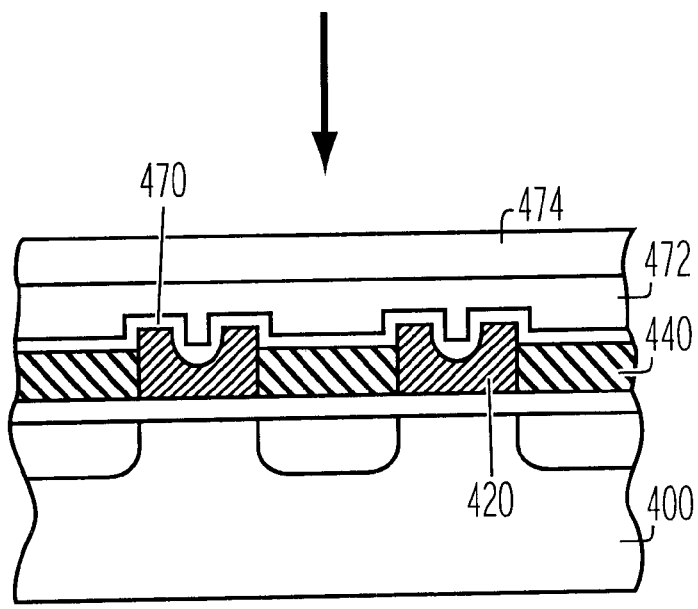

As illustrated in FIG. 4I, dielectric layer 470 is deposited over the polysilicon layer 420 and the oxide layer 440. Preferably, the dielectric layer 470 is an oxide-nitride-oxide (ONO) layer. In a preferred embodiment, the ONO layer comprises a high temperature oxide deposited by CVD, a CVD nitride and another high temperature oxide deposited by CVD. In this preferred embodiment, the thickness of the first oxide layer is 62 Angstroms, the thickness of the nitride layer is 62 Angstroms, and the thickness of the bottom oxide layer is 45 Angstroms. The deposition of the second dielectric layer is followed by deposition of a second polysilicon layer 472, and $WSI_x$ 474, which combine to form the control gate.

To complete the memory device, conventional flash memory fabrication steps are performed. In a preferred embodiment, the resulting memory array includes a bit-line pitch of 0.95 µm, and a word-line pitch of 0.4 µm. In variations of the present invention, individual cell sizes may be further reduced in dimensions by reducing the pitch between individual memory cells. For example, the oxide structures 440 (or 126 in FIG. 1) may be clipped in the word-line direction to provide an open region on top of the tunnel oxide layer for receiving boron phosphosilicate glass (BSPG), as disclosed in "A 0.24-µm Cell Process With 0.18-µm Width Isolation and 3D Interpoly Dielectric Films for 1-GB Flash Memories" by Kobayashi et al., and incorporated by reference herein.

Figure 5:
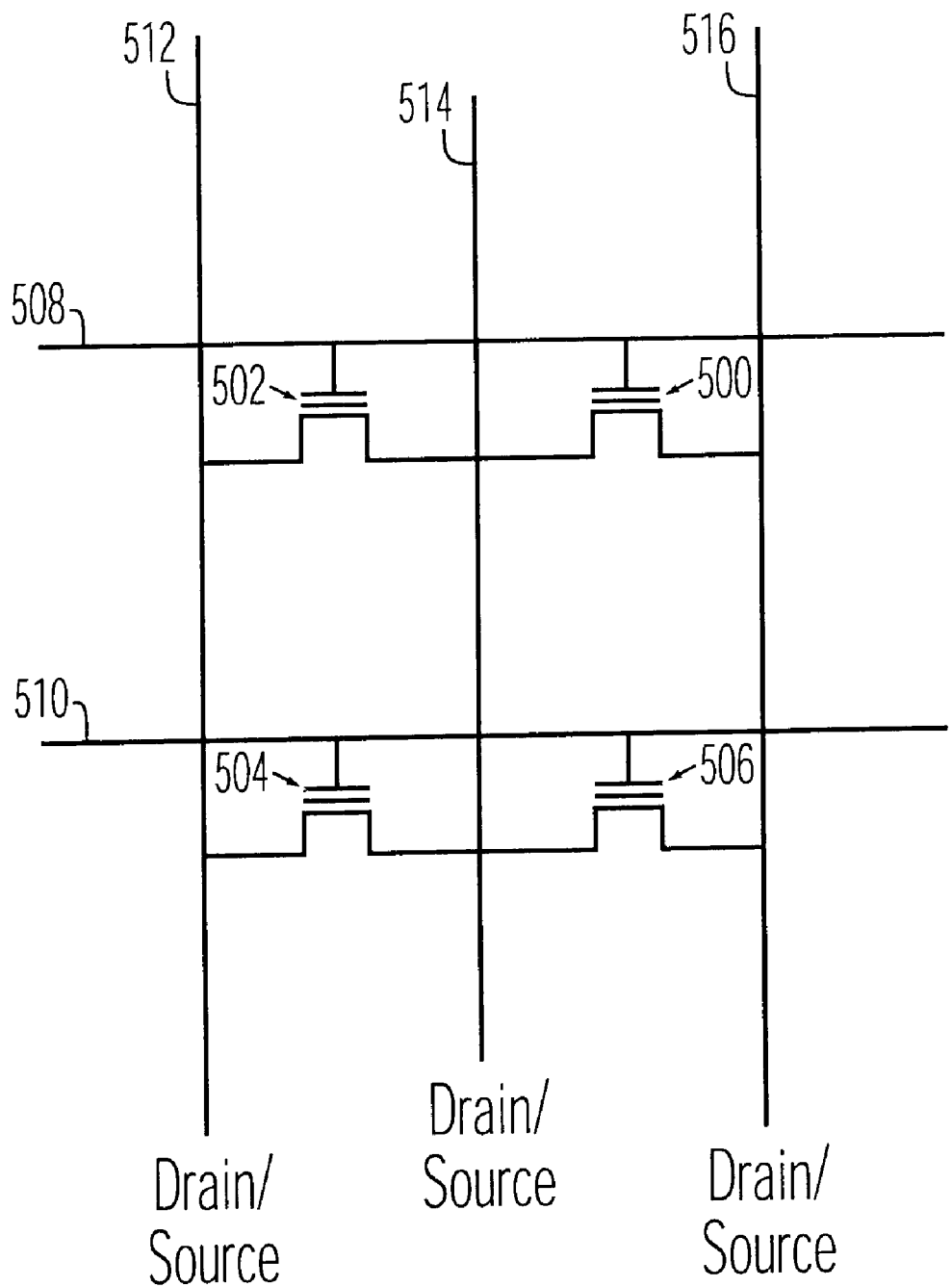
FIG. 5 illustrates a schematic of a non-volatile memory device that may be employed with this invention.

FIG. 5 illustrates a memory device architecture within which the memory cells of the present invention may be used. As illustrated, two-dimensional array of memory cells is formed by arranging floating gate transistors into rows and columns. A right column comprises transistors 500 and 506. A left column comprises transistors 502 and 504. The first row of the array comprises transistors 502 and 500. The second row of the array comprises transistors 504 and 506. The sources of transistors are connected to buried bit-line 514. The drain of transistors 502 and 504 are connected to buried bit-line 512. The gates of transistors 500 and 502 are connected to word-line 508. The gates of the transistors 504 and 506 are connected to word-line 510.

An X-Y addressing system is affected by word-line 508 and 510 and the rows of memory cells that select on an X-axis and the bit-lines 512 and 516 and the columns of memory cells on a Y-axis. When a memory cell such as 502 is addressed, appropriate voltages must be passed on to its drain and source by the bit-lines 512 and 514, respectively, and to its control gate via word-line 508. In this manner, any cell in the array may be addressed individually for programming, erasure, and read operations.

Alternative memory array device architectures may also be used with this invention. For example, U.S. Pat. No. 5,696,019 to Chang, incorporated herein by reference, discloses a memory device architecture suitable with this invention comprising a plurality of columns of memory cells sharing one or more bit lines. The architecture is based on a source-drain cell configuration in which each column of cells has a single buried diffusion local source line. An isolation structure such as a trench oxide is positioned between each column of cells.

Memory cells of the present invention may be programmed by providing a positive voltage to the control gate and a negative voltage to the buried drain diffusion, while the buried p-type source diffusion is allowed to float. Under these conditions, electrons may tunnel from the valence band to the conduction band, leaving free holes in the valence bands. The positive voltage at the control gate attracts electrons towards the floating gate. The electrons are accelerated in the strong vertical electrical field between the drain diffusion and the control gate and a number of them become "hot" electrons with sufficient energy to be injected through a tunneling dielectric layer 106 (as shown by FIG. 1) into the floating gate 120 (FIG. 1).

Erasure is accomplished by F-N tunneling from the floating gate to the buried p-type source diffusion region. During erasure, a negative voltage is applied to the control gate, a positive voltage is applied to the source diffusion, and the drain is floating. Under these conditions, a forward bias will be imposed on the source diffusion and the n-well so that the n-well is positively charged. As a result, F-N tunneling erasure of electrons from the floating gate to a channel will take place. Reading is accomplished by providing a negative voltage to the drain diffusion and a negative voltage to the control gate, with the source at 0 volts. When the floating gate is charged, the threshold voltage for causing the p-channel transistor to conduct is decreased below the voltage applied to the control gate during a read operation. Thus a charged transistor will conduct during a read operation and an uncharged transistor will not conduct. The non-conducting state of the cell can be interpreted as a binary 1 or 0 depending on the polarity of the sensing circuitry.

The voltages required for programming, erasing, and/or reading operations depends in part on a coupling ratio between the floating gateland the control gate of the memory cell. The voltage across the floating gate may be characterized by the following equation:

$$V_{FG}=V_{CG}[C_{CR}/(C_{CR}+C_K)]$$

In the above equation, $C_{CR}$ is the capacitive couple ratio between the floating gate and the control gate. The factor $C_K$ represents the capacitive coupling of the floating gate across the tunnel oxide layer 206 for programming, erasing, or reading. As the above equation shows, the higher the coupling ratio between the floating gate and the control gate, the more equal the voltage across the floating gate is compared to the voltage across the control gate. As such, increasing the coupling ratio between the floating gate and the control gate decreases the voltage required to effectuate programming, erasing, or reading.

Some memory devices of the known art provide the floating gate with a greater coupling surface in order to increase the coupling ratio between the floating gate and the control gate. This has previously been accomplished by enlarging the lateral dimensions of the floating gate on the substrate. As such, the floating gates of the known art occupy a significant percentage of the real estate allocated on the memory array device. By contrast, this invention provides a comparable floating gate but having reduced lateral dimensions. More specifically, this invention provides for a floating gate having reduced later dimensions but which maintains or increases the coupling ratio between the floating gate and the control gate.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for forming a contoured floating gate for use in a floating gate memory cell, the method comprising:

forming a floating gate comprising a polysilicon layer over a substrate;

forming oxide layers on opposing sides of the floating gate, the oxide layer having a vertical thickness greater than a vertical thickness of the floating gate;

forming a spacer layer over the oxide layers and the floating gate;

removing a portion of the spacer layer such that a top surface of the floating gate positioned laterally toward a middle region of the floating gate is exposed; and removing a portion of the floating gate underlying the exposed top surface of the middle region to form the contoured floating gate.

2. The method of claim 1, wherein the floating gate includes a first end region at a first lateral end of the floating gate and a second end region at a second lateral end of the floating gate, and wherein the spacer layer formed during the step of forming the spacer layer has a vertical thickness at the first end region and a vertical thickness at the second end region that are each greater than a vertical thickness of the spacer layer at the middle region.

3. The method of claim 1, wherein the floating gate includes a first end region at a first lateral end of the floating gate and a second end region at a second lateral end of the floating gate and wherein the floating gate, after removing the portion of the floating gate, has a vertical thickness at the middle region that is less than a vertical thickness of the floating gate at the first end region and less than a vertical thickness of the floating gate at the second end region.

4. The method of claim 1, wherein the step of forming the floating gate includes planarizing a top surface of the floating gate.

5. The method of claim 1, wherein the step of removing a portion of the floating gate includes forming a new top surface in the middle region which is substantially parallel to the substrate.

6. The method of claim 1, wherein the step of removing a portion of the floating gate creates a rectangular shaped recess in the middle region of the floating gate.

7. The method of claim 1, wherein the step of removing a portion of the floating gate creates a recess in the floating gate having first and second sloped surfaces at angles less than 90° relative to the substrate.

8. The method of claim 7, wherein the first and second sloped surfaces are at angles between about 45° and 90° relative to the substrate.

9. The method of claim 1, wherein the step of forming the floating gate includes depositing the polysilicon layer and a masking layer over an insulating layer.

10. The method of claim 9, wherein the step of forming the floating gate includes etching a plurality of columns comprising the polysilicon layer and the masking layer.

11. The method of claim 10, wherein the step of forming the floating gate includes removing the masking layer from the plurality of columns.

12. The method of claim 9, wherein the masking layer comprises silicon nitride.

13. The method of claim 10, wherein the step of forming oxide layers includes depositing the oxide layers between each column comprising the polysilicon layer and the masking layer, and planarizing the oxide layers and the columns prior to removing the masking layer so that the vertical thickness of the oxide layer is greater than the vertical thickness of the floating gate.

14. The method of claim 1, wherein the spacer layer comprises a material selected from polysilicon, tetraethyl orthosilicate, and silicon nitride.

15. The method of claim 1, wherein the step of removing the portion of the floating gate underlying the exposed middle surface includes removing the spacer layer from the oxide layer and the middle surface of the floating gate in a single etch so as to expose the middle surface of the floating gate while maintaining the spacer layer over first end and second end regions of the floating gate.

16. The method of claim 15, wherein the step of removing a portion of the floating gate top includes etching the middle region of the floating gate.

17. A method for forming a floating gate memory cell, the method comprising:

providing a substrate;

forming source and drain regions over the substrate;

depositing an insulating layer over the source and drain regions; and forming a contoured floating gate positioned over the insulating layer between the source and drain regions, the floating gate being formed by
forming a floating gate comprising a polysilicon layer over a substrate,
forming oxide layers on opposing sides of the floating gate, the oxide layer having a vertical thickness greater than a vertical thickness of the floating gate,
forming a spacer layer over the oxide layers and the floating gate,
removing a portion of the spacer layer such that a middle surface of the floating gate positioned laterally toward a middle of the floating gate is expose, and
removing a portion of the floating gate underlying the exposed middle surface to form the contoured floating gate; and forming a dielectric layer over the contoured floating gate.

18. The method of claim 17, wherein the floating gate includes a first end region at a first lateral end of the floating gate and a second end region at a second lateral end of the floating gate, and wherein the spacer layer formed during the step of forming the spacer layer has a vertical thickness at the first end region and a vertical thickness at the second end region that are each greater than a vertical thickness of the spacer layer at the middle region.

19. The method of claim 17, wherein the floating gate includes a first end region at a first lateral end of the floating gate and a second end region at a second lateral end of the floating gate and wherein the floating gate, after removing the portion of the floating gate, has a vertical thickness at the middle region that is less than a vertical thickness of the floating gate at the first end region and less than a vertical thickness of the floating gate at the second end region.

20. The method of claim 17, wherein the step of forming the floating gate includes planarizing a top surface of the floating gate.

21. The method of claim 17, wherein the step of removing a portion of the floating gate includes forming a new top surface in the middle region which is substantially parallel to the substrate.

22. The method of claim 17, wherein the step of removing a portion of the floating gate creates a rectangular shaped recess in the middle region of the floating gate.

23. The method of claim 17, wherein the step of removing a portion of the floating gate creates a recess in the floating gate having first and second sloped surfaces at angles less than 90° relative to the substrate.

24. The method of claim 23, wherein the first and second sloped surfaces are at angles between about 45° and 90° relative to the substrate.

25. The method of claim 17, wherein the step of forming the floating gate includes depositing the polysilicon layer and a masking layer over an insulating layer prior to forming the floating gate.

26. The method of claim 25, wherein the step of forming the floating gate includes etching a plurality of columns comprising the polysilicon layer and the masking layer.

27. The method of claim 26, wherein the step of forming the floating gate includes removing the masking layer from the plurality of columns.

28. The method of claim 25, wherein the masking layer comprises silicon nitride.

29. The method of claim 26, wherein the step of forming oxide layers includes depositing the oxide layers between each column comprising the polysilicon layer and the masking layer, and planarizing the oxide layers and the columns prior to removing the masking layer so that the vertical thickness of the oxide layer is greater than the vertical thickness of the floating gate.

30. The method of claim 17, wherein the spacer layer comprises a material selected from polysilicon, tetraethyl orthosilicate, and silicon nitride.

31. The method of claim 17, wherein the step of removing the portion of the floating gate underlying the exposed middle surface includes removing the spacer layer from the oxide layer and the middle surface of the floating gate in a single etch so as to expose the middle surface of the floating gate while maintaining the spacer layer over first end and second end regions of the floating gate.

* * * * *